(12) United States Patent
Inoue et al.

(10) Patent No.: US 9,269,573 B2
(45) Date of Patent: Feb. 23, 2016

(54) THIN FILM TRANSISTOR HAVING CRYSTALLINE INDIUM OXIDE SEMICONDUCTOR FILM

(75) Inventors: Kazuyoshi Inoue, Sodegaura (JP); Koki Yano, Sodegaura (JP); Shigekazu Tomai, Sodegaura (JP); Futoshi Utsuno, Sodegaura (JP); Masashi Kasami, Sodegaura (JP); Kenji Goto, Sodegaura (JP); Hirokazu Kawashima, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 12/212,688

(22) Filed: Sep. 18, 2008

(65) Prior Publication Data
US 2010/0065835 A1  Mar. 18, 2010

(30) Foreign Application Priority Data
Sep. 17, 2008 (JP) .................. 2008-238353

(51) Int. Cl.
*H01L 29/10* (2006.01)
*H01L 21/02* (2006.01)
*H01L 29/786* (2006.01)

(52) U.S. Cl.
CPC .... *H01L 21/02565* (2013.01); *H01L 21/02422* (2013.01); *H01L 21/02631* (2013.01); *H01L 29/7869* (2013.01)

(58) Field of Classification Search
CPC ....................................................... H01L 29/10
See application file for complete search history.

(56) References Cited

U.S. PATENT DOCUMENTS

| 2005/0275038 A1 * | 12/2005 | Shih et al. ..................... 257/382 |
| 2006/0071211 A1 * | 4/2006 | Lee ................................. 257/59 |

FOREIGN PATENT DOCUMENTS

| EP | 1 950 177 A1 | 7/2008 |
| JP | 2004-119525 A | 4/2004 |
| WO | WO 2007/058248 A1 | 5/2007 |
| WO | WO 2007088722 A1 * | 8/2007 |

* cited by examiner

*Primary Examiner* — Marvin Payen
(74) *Attorney, Agent, or Firm* — Oblon, McClelland, Maier & Neustadt, L.L.P.

(57) ABSTRACT

To provide a thin film transistor having an indium oxide-based semiconductor film which allows only a thin metal film on the semiconductor film to be selectively etched. A thin film transistor having a crystalline indium oxide semiconductor film which is composed mainly of indium oxide and contains a positive trivalent metal oxide.

15 Claims, 3 Drawing Sheets

THIN FILM TRANSISTOR HAVING CRYSTALLINE INDIUM OXIDE SEMICONDUCTOR FILM

TECHNICAL FIELD

The invention relates to a thin film transistor having a semiconductor film composed of a crystalline indium oxide which is composed mainly of indium oxide and contains a positive trivalent metal oxide.

BACKGROUND ART

In recent years, display apparatuses have attained remarkable progress. As a result, various display apparatuses such as liquid crystal displays and EL displays are briskly introduced into office automation apparatuses such as PCs and word processors. Each of these display apparatuses has a sandwich structure in which a display device is between transparent conductive films.

Silicon-based semiconductor films constitute the mainstream of switching devices for driving the above-mentioned display apparatuses, due to their excellent stability and processability, as well as their high switching speed. These silicon-based thin films are generally prepared by the chemical vapor deposition (CVD) method.

However, if amorphous, the silicon-based thin films have the disadvantage that, since the switching-speed is relatively low, they cannot display an image when an attempt is made to display images of high-speed animated films or the like. For a crystalline silicon-based thin film, the switching speed is relatively high. However, heating at a temperature of 800° C. or higher or heating by means of a laser is necessary for crystallization, thereby requiring a large amount of energy or a number of steps during the production. Although a silicon-based thin film is excellent also as a voltage element, it suffers from a problem that the characteristics thereof may vary with time when an electric current is passed therethrough.

As a material or the like for obtaining a transparent semiconductor film which is more improved in stability than silicon-based thin films and has a light transmittance equivalent to that of an ITO film, a sputtering target composed of indium oxide, gallium oxide and zinc oxide or a transparent semiconductor thin film composed of zinc oxide and magnesium oxide has been proposed (Patent Document 1, for example). A transparent semiconductor film composed of indium oxide, gallium oxide and zinc oxide, or a transparent semiconductor film composed of zinc oxide and magnesium oxide has the characteristic that it can be etched very quickly with a weak acid. However, these transparent semiconductor thin films are etched with an etchant for a thin metal film. Therefore, when etching a thin metal film on these transparent semiconductor thin films, the transparent semiconductor thin film may be etched simultaneously with the thin metal film. Accordingly, these transparent semiconductor thin films are not suitable when a thin metal film on a transparent semiconductor film is selectively etched.

A film containing crystalline indium oxide, particularly a polycrystalline film, tends to generate oxygen deficiency. Accordingly, having a carrier density of $2 \times 10^{+17}$ cm$^{-3}$ was considered to be difficult even if an oxygen partial pressure during film formation is increased or an oxygen treatment or the like is performed. Therefore, almost no attempt has been made to use this polycrystalline film as a semiconductor film or a TFT.

Patent Document 2 discloses a semiconductor film of indium oxide having a bixbite structure which is obtained by incorporating a positive divalent metal oxide into indium oxide, with an attempt of decreasing the carrier density by incorporating a positive divalent metal oxide. However, in the case of the positive divalent metal oxide, an impurity level may be formed within a band gap of the energy band structure of the bixbite structure, which may decrease the mobility.

Patent Document 1: JP-A-2004-119525
Patent Document 2: WO2007/058248

An object of the invention is to provide a thin film transistor having an indium oxide-based semiconductor film which can allow only a thin metal film on the semiconductor film to be selectively etched.

DISCLOSURE OF THE INVENTION

In order to attain the above-mentioned object, the inventors have made extensive studies. As a result, the inventors have found that, by using a semiconductor film formed by incorporating a positive trivalent metal oxide into indium oxide, only a thin metal film on the semiconductor film can be selectively etched and a high-performance thin film transistor can be obtained. The invention has been made based on this finding.

The invention provides the following thin film transistor.

1. A thin film transistor having a crystalline indium oxide semiconductor film which is composed mainly of indium oxide and contains a positive trivalent metal oxide.
2. The thin film transistor according to 1, wherein the positive trivalent metal oxide is one or two or more oxides selected from boron oxide, aluminum oxide, gallium oxide, scandium oxide, yttrium oxide, lanthanum oxide, praseodium oxide, neodymium oxide, samarium oxide, europium oxide, gadrinium oxide, terbium oxide, dyspronium oxide, holnium oxide, erbium oxide, thulium oxide, ytterbium oxide and luthetium oxide.
3. The thin film transistor according to 1 or 2, wherein the ratio of the metal element (M) in the positive trivalent metal oxide to the total amount of indium element (In) in the indium oxide and the metal element (M) in the positive trivalent metal oxide [M/(M+In): atomic ratio] is 0.0001 to 0.1.
4. A method for producing the thin film transistor according to any one of 1 to 3 comprising the steps of:
   forming a semiconductor film containing indium oxide and a positive trivalent metal oxide; and
   oxidizing the semiconductor film and/or crystallizing the semiconductor film.
5. The method for producing the thin film transistor according to 4, wherein the semiconductor film is subjected to a heat treatment at 150° C. to 450° C. for 0.5 to 1200 minutes in the presence of oxygen.
6. The method for producing the thin film transistor according to 4 or 5 which is a method for producing a channel-etch type thin film transistor.
7. The method for producing the thin film transistor according to 4 or 5 which is a method for producing an etch stopper-type thin film transistor.

According to the invention, by using a semiconductor film formed by incorporating a positive trivalent metal oxide in indium oxide, only a thin metal film on the semiconductor film can be selectively etched. In addition, a high-performance thin film transistor can be obtained.

BEST MODE FOR CARRYING OUT THE INVENTION

The thin film transistor (TFT) of the invention has a crystalline indium oxide semiconductor film of which the main component is indium oxide and which contains a positive trivalent metal oxide.

Figure 1:
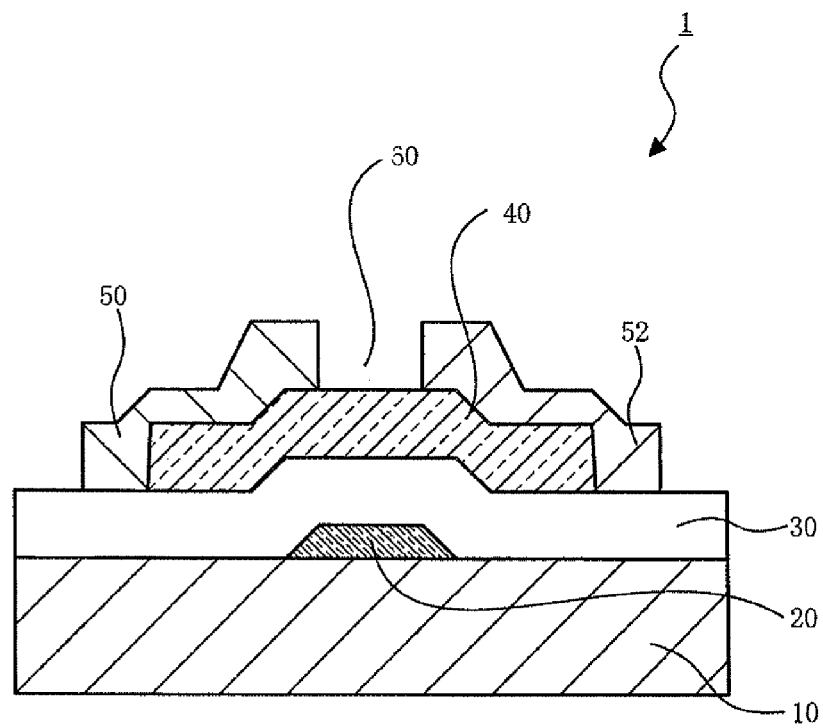
FIG. 1 is a schematic cross-sectional view showing one embodiment of the thin film transistor of the invention.

FIG. 1 is a schematic cross-sectional view showing an embodiment of the thin film transistor of the invention.

A thin film transistor 1 has a gate electrode 20 between a substrate 10 and an insulating film 30. On the gate insulating film 30, a semiconductor film 40 is stacked as an active layer. Furthermore, each of a source electrode 50 and a drain electrode 52 is provided so as to cover areas near the end portions of the semiconductor film 40. A channel part 60 is formed in an area surrounded by the semiconductor film 40, the source electrode 50 and the drain electrode 52.

The thin film transistor 1 shown in FIG. 1 is a so-called channel-etch type thin film transistor. The thin film transistor of the invention is not limited to a channel-etch type thin film transistor, and a device structure known in this technical field can be used. For example, the thin film transistor of the invention may be an etch-stopper type thin film transistor.

Figure 2:
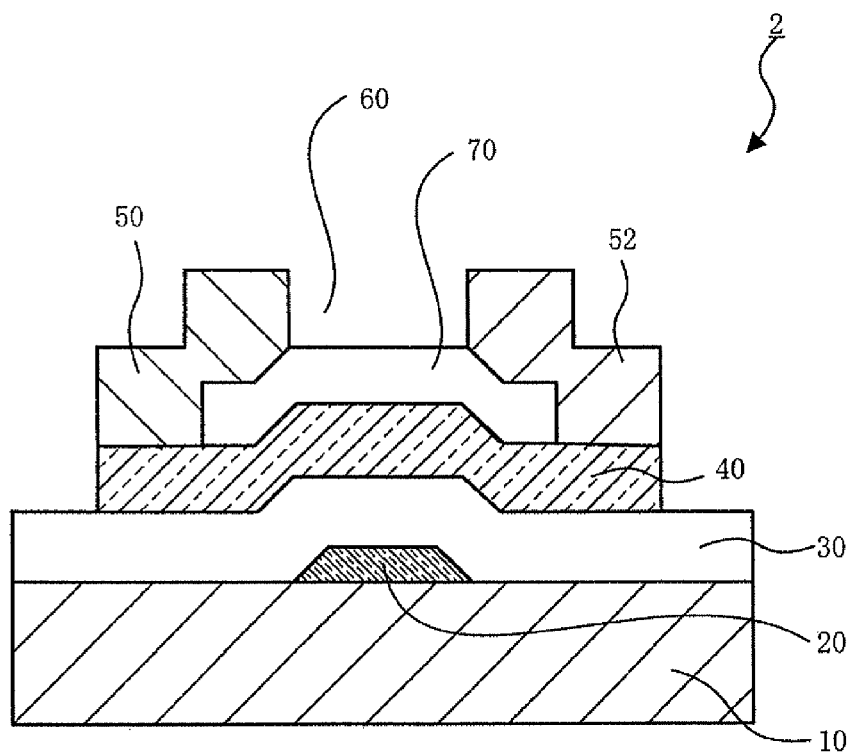
FIG. 2 is a schematic cross-sectional view showing another embodiment of the thin film transistor of the invention.

FIG. 2 is a schematic cross-sectional view showing another embodiment of the thin film transistor of the invention. The same elements as those in the above-mentioned thin film transistor 1 are indicated by the same numerals, and a detailed explanation thereof is omitted.

A thin film transistor 2 is an etch-stopper type thin film transistor. The thin film transistor 2 has the same configuration as that of the above-mentioned thin film transistor 1, except that an etch stopper 70 is formed so as to cover the channel part 60. The source electrode 50 and the drain electrode 52 are each provided so as to cover areas near the end portions of the semiconductor film 40 and areas near the end portions of the etch stopper 70.

In the invention, a crystalline indium oxide semiconductor film which is composed mainly of indium oxide and contains a positive trivalent metal oxide is used as the semiconductor film 40. By using this semiconductor film, the semiconductor film is prevented from being etched during etching of the source electrode 50 and the drain electrode 52. In addition, the carrier density of the semiconductor film can be decreased. For example, the carrier density can be decreased to less than $2 \times 10^{+17}$ cm$^{-3}$ at around room temperature. As a result, the thin film transistor can exhibit good thin film transistor properties.

The carrier density at around room temperature is preferably less than $10^{+17}$ cm$^{-3}$. If the carrier density is $2 \times 10^{+17}$ cm$^{-3}$ or more, it may not function as a thin film transistor. Even though it can function as a thin film transistor, the thin film transistor may be in the normally-on state, the threshold voltage may be a large minus value and the on-off value may be reduced.

The "composed mainly of indium oxide" means that the content (atomic ratio) of the In elements in the total metal elements constituting the semiconductor film exceeds 90%. Since the content of the In elements exceeds 90%, the mobility of the TFT can be increased.

The "crystalline film" means a film of which the crystalline peak can be confirmed by an X-ray diffraction analysis. Durability of the TFT can be increased by allowing the semiconductor film to be a crystalline film.

The crystalline film may be any of a mono-crystalline film, an epitaxial film and a polycrystalline film. In view of easiness in commercial production and capability of increasing in size, an epitaxial film and a polycrystalline film are preferable, with a polycrystalline film being particularly preferable.

If the crystalline film is a polycrystalline film, it is preferred that the polycrystalline film be formed of a nanocrystal. The average crystal size obtained by the Scherrer's equation using the results of the X-ray diffraction analysis is normally 500 nm or less, preferably 300 nm or less, more preferably 150 nm or less, and still more preferably 80 nm or less. If the average crystal size is larger than 500 nm, variation may be increased when the transistor is made miniscule.

As the positive trivalent metal oxide to be incorporated in the semiconductor film, one or two or more oxides selected from boron oxide, aluminum oxide, gallium oxide, scandium oxide, yttrium oxide, lanthanum oxide, praseodium oxide, neodyum oxide, samarium oxide, europium oxide, gadrinium oxide, terbium oxide, dyspronium oxide, holnium oxide, erbium oxide, thulium oxide, ytterbium oxide and luthetium oxide are preferable. Since these oxides have a strong bonding power with oxygen, the oxygen deficiency amount in the polycrystalline indium oxide thin film can be decreased. Oxygen deficiency is considered to occur frequently in a grain boundary. The above-mentioned metal oxides have an ionic radius different from that of indium, and therefore, are considered to exist in a large amount in a grain boundary rather than within a crystal. Due to their strong bonding power with oxygen, the above-mentioned metal oxides can suppress occurrence of oxygen deficiency in a grain boundary. As a result, the carrier density at around room temperature can be controlled to be less than $10^{+17}$ cm$^{-3}$.

Of the above-mentioned metal oxides, aluminum oxide, gallium oxide, yttrium oxide, ytterbium oxide, erbium oxide, holnium oxide, dyspronium oxide and samarium oxide are preferable, with gallium oxide, yttrium oxide and ytterbium oxide being more preferable.

It is preferred that the positive trivalent metal oxide form a solid solution with indium oxide. The entire positive trivalent metal oxide is not required to form a solid solution with indium oxide.

In the invention, it is preferred that the atomic ratio of the metal element (M) to the total amount of the indium element (In) in the indium oxide and the metal element (M) in the trivalent metal oxide in the semiconductor film [M/(M+In): atomic ratio] be 0.0001 to 0.1. If the atomic ratio is less than 0.0001, the amount of the metal atom (M) added is small, and effects of suppressing oxygen deficiency are small. As a result, the barrier density may be $2 \times 10^{+17}$ cm$^{-3}$ or more. On the other hand, if the atomic ratio exceeds 0.1, the crystallinity of the semiconductor film is lowered, and the amount of oxygen deficiency is increased. As a result, the carrier density may become $2 \times 10^{+17}$ cm$^{-3}$ or more, the semiconductor film may not act as a thin film transistor. Even though it functions as a thin film transistor, the thin film transistor may be in the normally-on state, the threshold voltage may be a large minus value and the on-off value may be reduced. Furthermore, if a large amount of the positive trivalent metal oxide is contained, the semiconductor film may not be crystallized, and as a result, the semiconductor film may be dissolved in an etchant, which may make selective etching impossible.

The ratio of the metal element (M) [M/(M+In)] is more preferably 0.0005 to 0.05, and particularly preferably 0.001 to 0.05.

The ratio of the metal element (M) can be obtained by measuring the amount of each element by ICP (Inductively Coupled Plasma).

The ratio of the metal element (M) can be controlled by adjusting the amount of each element in a sputtering target used in forming the semiconductor film, for example. The composition of the semiconductor film is almost the same as that of a sputtering target.

In the thin film transistor of the invention, as the material for members constituting the thin film transistor such as a substrate, a gate electrode, a gate insulating film and source/drain electrodes, known materials may be used, with no particular limitations being imposed.

For example, a thin film of a metal such as Al, Cu and Au can be used in each electrode, and a thin film of an oxide such as silicon oxide and hafnium oxide can be used in the gate insulating film.

Next, a method for producing the thin film transistor of the invention will be described.

The method for producing the thin film transistor of the invention comprises a film-forming step in which a semiconductor film containing indium oxide and a trivalent metal oxide and a step of oxidizing or crystallizing the semiconductor film. The member constituting the thin film transistor such as the gate electrode, the gate insulating film and the source/drain electrode may be formed by a known method.

For example, a gate electrode composed of a thin film of a metal such as Al, Cu and Au is formed on a substrate, and a thin film of an oxide such as silicon oxide and hafnium oxide is formed thereon as a gate insulating film. A metal mask is put thereon, thereby forming a semiconductor film composed of an indium oxide film which contains a trivalent metal oxide. Thereafter, by means of a metal mask, source/drain electrodes are formed in necessary parts, whereby a thin film transistor can be produced.

The semiconductor film can be formed by the sputtering method, the ion plating method, the deposition method, or the like. Of these, the sputtering method is preferable.

In the sputtering, it is preferable to use a sintered target of a composite oxide. Specifically, a sintered target of a composite oxide in which a trivalent metal oxide is added in indium oxide is preferable. The sintered target of the composite oxide can be produced by methods which are known in this technical field.

The sputtering conditions can be appropriately adjusted by the target used, the film thickness of the semiconductor film, or the like. As the sputtering method, the RF sputtering method, the DC sputtering method and the AC sputtering method can be used. Of these, the DC sputtering method and the AC sputtering method are preferable since the film-forming speed is high.

In the method for producing the thin film transistor of the invention, after the formation of the semiconductor film, a step is carried out for oxidizing and/or crystallizing the thin film.

Crystallization and oxidation of the semiconductor film are conducted in the presence of oxygen by means of a lamp anneal apparatus, a laser anneal apparatus, a hot air heating apparatus, a contact heating apparatus or the like.

It is preferred that the semiconductor film be subjected to heat treatment at a temperature of 150 to 450° C. for 0.5 to 1200 minutes in the presence of oxygen. If the temperature is lower than 150° C., the semiconductor film may not be sufficiently crystallized. If the temperature exceeds 450° C., the substrate or the semiconductor film may be damaged. It is preferred that the heat treatment temperature be 180° C. to 350° C., with 200° C. to 300° C. being particularly preferable.

If the heat treatment time is less than 0.5 minutes, crystallization of the film may be insufficient since the heat treatment time is too short. A heat treatment time exceeding 1200 minutes is too long, and therefore, not productive. A heat treatment time of 1 to 600 minutes is further preferable, with 5 to 60 minutes being particularly preferable.

Crystallization and/or oxidization may be performed immediately after the formation of the semiconductor film, or may be performed after the formation of other members such as the source/drain electrodes.

The method for producing the thin film transistor of the invention is particularly suited to the production of a channel-etch type thin film transistor. Since the semiconductor film of the invention is crystalline, as the method for forming source/drain electrodes and a channel part from a thin film of a metal such as Al, etching by photolithography can be used. That is, with an etchant for removing a thin metal film, a semiconductor film is not etched, allowing a thin metal film to be selectively etched. The method of the invention may be a method for producing an etch-stopper type thin film transistor.

EXAMPLES

Example 1

(A) Preparation of a Thin Film Transistor

Figure 3:
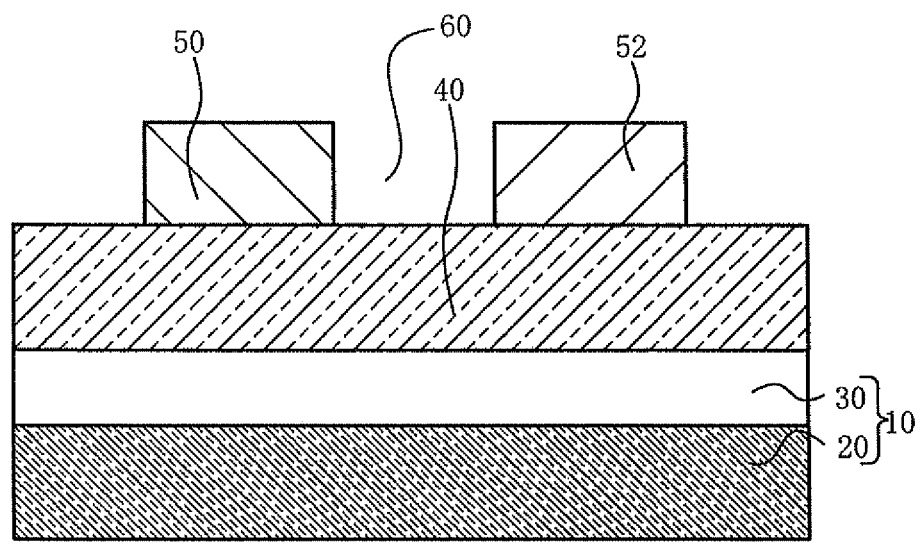
FIG. 3 is a schematic cross-sectional view showing the thin film transistor prepared in Example 1.

A channel-etch type thin film transistor as shown in FIG. 3 was prepared by the photo-resist method.

A 200 nm-thick conductive silicon substrate 10 having a thermally oxidized film ($SiO_2$ film) was used. The thermally oxidized film functioned as a gate insulating film 30, and a conductive silicon part functioned as a gate electrode 20.

By using a target composed of indium oxide-gallium oxide [Ga/(In+Ga)=0.03: atomic ratio)], a semiconductor film 40 having a thickness of 40 nm was formed by the sputtering method on the gate insulating film 30. Sputtering was conducted as follows. After performing vacuum deaerating until the back pressure became $5\times10^{-4}$ Pa, the pressure was adjusted to 0.2 Pa by flowing argon and oxygen at 9.5 sccm and 0.5 sccm, respectively. Sputtering was conducted at room temperature at a sputtering power of 100 W.

After the formation of the semiconductor film 40, this substrate was subjected to heat treatment at 300° C. for 30 minutes in air using a hot air heating furnace.

Thereafter, a metal film of molybdenum was formed in a thickness of 300 nm on the semiconductor film 40 and the gate insulting film 30.

A resist was applied to the molybdenum metal film, and the resultant was pre-baked at 80° C. for 15 minutes. Thereafter, the resist film was irradiated with UV light (light intensity: 300 mJ/$cm^2$) through a mask, followed by development in 3 wt % tetramethylammonium hydroxide (TMAH). After washing with pure water, the resist film was post-baked at 130° C. for 15 minutes to form a resist pattern with the desired shape of source/drain electrodes.

The molybdenum metal film was etched by treating the substrate with the resist pattern with an acid mixture of phosphoric acid, acetic acid and nitric acid, whereby a source electrode 50 and a drain electrode 52 were formed. The substrate was then washed with pure water and dried by air-blowing, whereby a thin film transistor (the distance (L)

between the source electrode and the drain electrode in a channel part 60 was 200 μm, and the width (W) was 500 μm) was prepared.

The resulting thin film transistor exhibited normally-off characteristics with a field-effect mobility of 4.5 cm$^2$/V·sec and an on-off ratio of 10$^8$. The output characteristics showed a clear pinch-off. The shift voltage (Vth) after applying a voltage of 20V to the gate electrode for 100 minutes was 0.2V.

(B) Evaluation of the Semiconductor Film

A semiconductor film was formed on a quartz glass. substrate under the same sputtering conditions as mentioned in (A) above. The substrate was then subjected to a heat treatment in air at 300° C. for 30 minutes using a hot air heating furnace. An X-ray diffraction analysis (XRD) of the resulting semiconductor film showed a peak derived from the bixbite structure of indium oxide. As a result, the semiconductor film was confirmed to be crystalline. The carrier density obtained by the hall effect measurement was 8×10$^{+16}$/cm$^3$.

An XRD measurement was similarly conducted for a semiconductor film obtained by performing the heat treatment of the semiconductor film in air at 450° C. for 5 hours. The X-ray diffraction peak intensity after the heat treatment at 300° C. was about 95% of the peak intensity after the heat treatment at 450° C.

Example 2

A thin film transistor was prepared in the same manner as in Example 1, except that a target composed of indium oxide-ytterbium oxide [Yb/(Yb+In) 0.03: atomic ratio)] was used as the sputtering target.

The resulting thin film transistor exhibited normally-off characteristics with a field-effect mobility of 1.2 cm$^2$/V·sec and an on-off ratio of 10$^7$. The output characteristics showed a clear pinch-off.

The results of the XRD measurement showed that the semiconductor film was crystalline. A peak derived from the bixbite structure of indium oxide was observed. The carrier density obtained by the hall effect measurement was 8×10$^+$$_{16}$/cm$^3$.

Thin film transistors were prepared in the same manner as in Example 1, except that, instead of the sputtering target containing gallium oxide, sputtering targets containing boron oxide, aluminum oxide, scandiumoxide, yttriumoxide, lanthanum oxide, praseodium oxide, neodyum oxide, samarium oxide, europium oxide, gadrinium oxide, terbium oxide, dyspronium oxide, holnium oxide, erbium oxide, thulium oxide, ytterbium oxide and luthetium oxide were used. The resulting thin film transistors exhibited thin film transistor characteristics almost similar to those in Example 2. As a result of an XRD measurement for each semiconductor film, a peak derived from the bixbite structure of indium oxide was also observed. The carrier density obtained by the hall effect measurement was 10$^{+17}$/cm$^3$ or less.

The compositions of the sputtering targets used and the characteristics of the resulting thin film transistors are shown below.

Boron oxide: B/(B+In)=0.004

The thin film transistor exhibited normally-off characteristics with a field-effect mobility of 8.2 cm$^2$/V·sec and an on-off ratio of 10$^5$. The output characteristics showed a clear pinch-off.

Aluminum oxide: Al/(Al+In)=0.005

The thin film transistor exhibited normally-off characteristics with a field-effect mobility of 6.2 cm$^2$/V·sec and an on-off ratio of 10$^5$. The output characteristics showed a clear pinch-off.

Scandium oxide: Sc/(Sc+In)=0.02

The thin film transistor exhibited normally-off characteristics with a field-effect mobility of 4.2 cm$^2$/V·sec and an on-off ratio of 10$^6$. The output characteristics showed a clear pinch-off.

Yttrium oxide: Y/(Y+In)=0.05

The thin film transistor exhibited normally-off characteristics with a field-effect mobility of 6.8 cm$^2$/V·sec and an on-off ratio of 10$^7$. The output characteristics showed a clear pinch-off.

Lanthanium oxide: La/(La+In)=0.02

The thin film transistor exhibited normally-off characteristics with a field-effect mobility of 5.1 cm$^2$/V·sec and an on-off ratio of 10$^6$. The output characteristics showed a clear pinch-off.

Neodyum oxide: Nd/(Nd+In)=0.01

The thin film transistor exhibited normally-off characteristics with a field-effect mobility of 8.4 cm$^2$/V·sec and an on-off ratio of 10$^6$. The output characteristics showed a clear pinch-off.

Samarium oxide: Sm/(Sm+In)=0.05

The thin film transistor exhibited normally-off characteristics with a field-effect mobility of 7.6 cm$^2$/V·sec and an on-off ratio of 10$^7$. The output characteristics showed a clear pinch-off.

Europium oxide: Eu/(Eu+In)=0.03

The thin film transistor exhibited normally-off characteristics with a field-effect mobility of 5.3 cm$^2$/V·sec and an on-off ratio of 10$^7$. The output characteristics showed a clear pinch-off.

Gadrinium oxide: Gd/(Gd+In)=0.03

The thin film transistor exhibited normally-off characteristics with a field-effect mobility of 6.7 cm$^2$/V·sec and an on-off ratio of 10$^7$. The output characteristics showed a clear pinch-off.

Terbium oxide: Tb/(Tb+In)=0.005

The thin film transistor exhibited normally-off characteristics with a field-effect mobility of 3.3 cm$^2$/V·sec and an on-off ratio of 10$^7$. The output characteristics showed a clear pinch-off.

Dyspronium oxide: Dy/(Dy+In)=0.01

The thin film transistor exhibited normally-off characteristics with a field-effect mobility of 14.7 cm$^2$/V·sec and an on-off ratio of 10$^7$. The output characteristics showed a clear pinch-off.

Erbium oxide: Er/(Er+In)=0.01

The thin film transistor exhibited normally-off characteristics with a field-effect mobility of 11.4 cm$^2$/V·sec and an on-off ratio of 10$^7$. The output characteristics showed a clear pinch-off.

Thulium oxide: Tm/(Tm+In)=0.02

The thin film transistor exhibited normally-off characteristics with a field-effect mobility of 8.3 cm$^2$/V·sec and an on-off ratio of 10$^7$. The output characteristics showed a clear pinch-off.

Luthetium oxide: Lu/(Lu+In)=0.003

The thin film transistor exhibited normally-off characteristics with a field-effect mobility of 6.9 cm$^2$/V·sec and an on-off ratio of 10$^7$. The output characteristics showed a clear pinch-off.

Example 3

Figure 4:
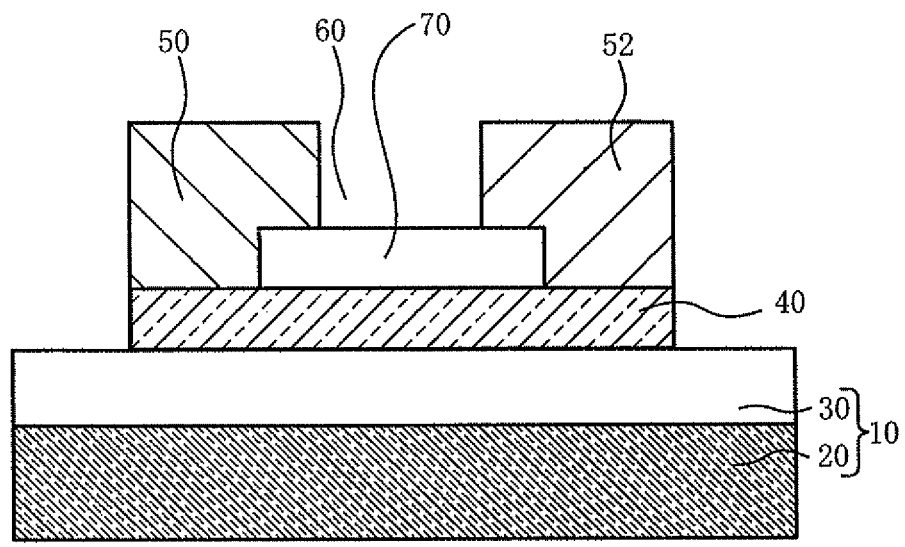
FIG. 4 is a schematic cross-sectional view showing the thin film transistor prepared in Example 3.

An etch stopper-type thin film transistor shown in FIG. 4 was prepared by the photo-resist method.

On a conductive silicon substrate 10 provided with a thermally oxidized film 30 (SiO$_2$ film), as in the same manner as in Example 1, a semiconductor film 40 having a thickness of 40 nm was formed by the sputtering method by using a target composed of indium oxide-yttrium oxide [Y/(In+Y)=0.03: atomic ratio)].

Then, using an Si as a target, argon and oxygen were flowed at 7 sccm and 3 sccm, respectively, a film was formed in a thickness of 100 nm at a pressure of 0.5 Pa. Thereafter, a resist was applied and the resultant was pre-baked at 80° C. for 15 minutes. The resist film was irradiated with UV rays (light intensity: 300 mJ/cm$^2$) through a mask, followed by development with 3 wt % of tetramethylammonium hydroxide (TMAH). After washing with pure water, the resist film was post-baked at 130° C. for 15 minutes, and a pattern was formed in a part constituting a channel part 60. By dry etching with $CF_4$, an etch stopper 70 was formed. The resist was peeled off by using a resist-peeling agent, and the substrate was washed with water and dried by air-blowing.

Thereafter, a molybdenum metal film was formed in a thickness of 300 nm on the semiconductor film 40, the etch stopper 70 and the thermally-oxidized film 30.

A resist was applied on the molybdenum metal film, and the resultant was pre-baked at 80° C. for 15 minutes. Thereafter, the resist film was irradiated with UV rays (light intensity: 300 mJ/cm$^2$) through a mask, followed by development with 3 wt % tetramethylammonium hydroxide (TMAH). After washing with pure water, the resist film was post-baked at 130° C. for 15 minutes, whereby a resist pattern having the shape of the source electrode 50 and the drain electrode 52 was formed.

The molybdenum metal film was etched by treating the substrate having a resist pattern with an acid mixture of phosphoric acid, acetic acid and nitric acid. In this case, the semiconductor film 40 was not crystallized. The semiconductor film 40 can be simultaneously etched with the molybdenum metal film by treating with an acid mixture of phosphoric acid, acetic acid and nitric acid. In addition, since the channel part 60 was protected by the etch stopper 70, the semiconductor film 40 was not etched.

After peeling off the resist, the resist was washed with pure water and dried by air-blowing. The resist was then subjected to heat treatment at 300° C. for 30 minutes in air using a hot air heating furnace, whereby a thin film transistor (gap (L) between the source electrode and the drain electrode: 200 μm: width (W): 500 μm) was prepared.

If the above-mentioned heat treatment is performed before etching of the molybdenum metal film, the semiconductor film is crystallized. The crystallized film cannot be etched with an acid mixture of phosphoric acid, acetic acid and nitric acid. In such a case, to allow the semiconductor film to be etched simultaneously with the molybdenum metal film, the semiconductor film may be etched with aqua regia composed of hydrochloric acid, nitric acid and water, an aqueous hydrochloric solution containing ferric chloride, an aqueous HBr solution or the like. Since a strong acid is used in this etching, it is preferred that the heat treatment be performed at the final step.

The resulting thin film transistor exhibited normally-off characteristics with a field-effect mobility of 10.8 cm$^2$/V·sec and an on-off ratio of 10$^8$. The output characteristics showed a clear pinch-off. The shift voltage (Vth) after applying a voltage of 20V to the gate electrode for 100 minutes was 0.2V.

The semiconductor film was a crystalline film. The carrier density obtained by the hall effect measurement was 6×10$^+$$_{16}$/cm$^3$.

Figure 5:
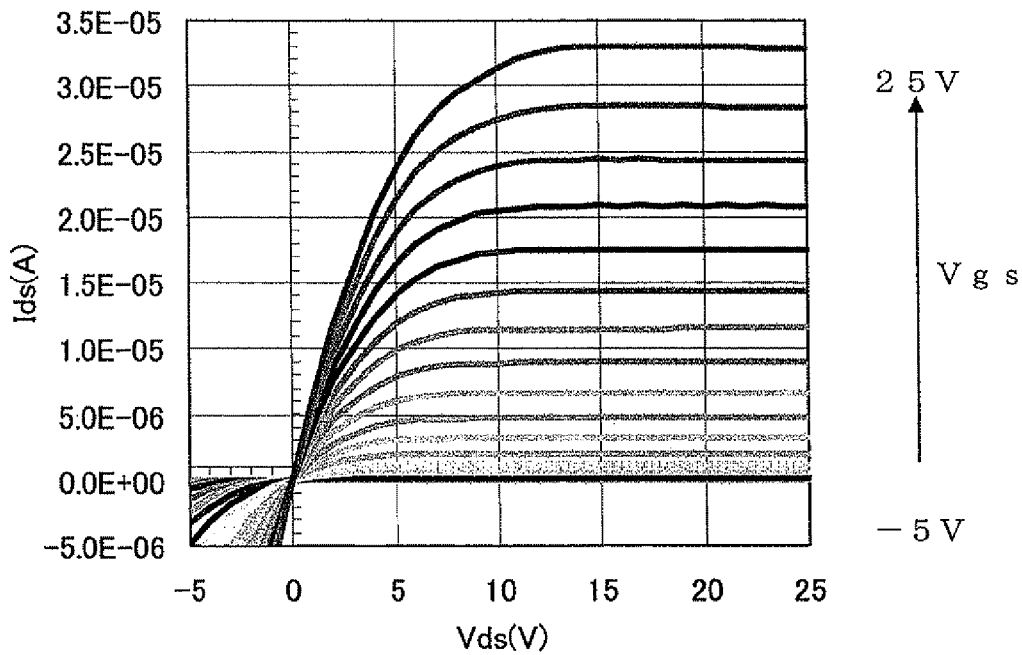
FIG. 5 is a view showing an output curve of the thin film transistor prepared in Example 3.
Figure 6:
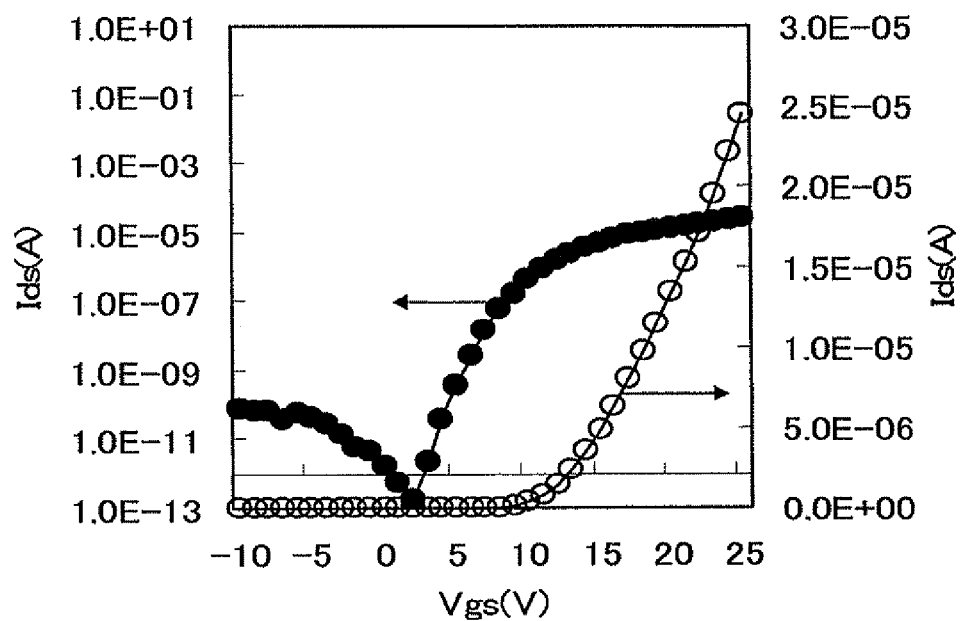
FIG. 6 is a view showing a transmission curve of the thin film transistor prepared in Example 3.

For the thin film transistor prepared in Example 3, the output curve is shown in FIG. 5, and the transmission curve is shown in FIG. 6. FIG. 5 shows a relationship between the drain voltage (Vds) and the drain current (Ids) when the gate voltage (Vgs) was changed within a range of −5V to 25V. FIG. 6 shows a relationship between the gate voltage (Vgs) and the drain current (Ids). The line composed of white dots is a line obtained by half-squaring the drain current against the gate voltage, and the line composed of black dots is a line showing the drain current against the gate electrode.

In FIGS. 5 and 6, the "XE-Y" means X×10$^{-Y}$. For example, 5.0 E-06 is 5.0×10$^{-6}$.

Comparative Example 1

A thin film transistor was prepared in the same manner as in Example 1, except that a target composed of indium oxide-gallium oxide-zinc oxide was used as a sputtering target. The composition of the sputtering target (atomic ratio) was as follows.
In/(In+Ga+Zn)=0.34
Ga/(In+Ga+Zn)=0.33
Zn/(In+Ga+Zn)=0.33
When the molybdenum metal film was etched, the semiconductor film 40 below the channel part 60 was also etched and disappeared. Therefore, TFT characteristics could not be measured.

Comparative Example 2

A thin film transistor was prepared in the same manner as in Example 1, except that a target composed of indium oxide-gallium oxide was used as a sputtering target. The composition of the sputtering target (atomic ratio) was as follows.
In/(In+Ga)=0.7
Ga/(In+Ga)=0.3
When the molybdenum metal film was etched, the semiconductor film 40 below the channel part 60 was also etched and disappeared. Therefore, TFT properties could not be measured.

Industrial Applicability

The thin film transistor of the invention may be used suitably in display panels, RFID tags, X-ray detector panels, and sensors such as fingerprint sensors and photo-sensors.

The method for producing a thin film transistor of the invention is particularly suited to the production of a channel-etch type thin film transistor.

The invention claimed is:
1. A thin film transistor having a crystalline indium oxide semiconductor film which is composed mainly of indium oxide and contains a positive trivalent metal oxide, having an atomic ratio of metal element M in the positive trivalent metal oxide to the total amount of indium in the indium oxide plus the metal element M in the positive trivalent metal oxide M/(M+In) of 0.0001 to 0.1, wherein the carrier density of the semiconductor film is less than 2×10$^{17}$ cm$^{-3}$ at around room temperature, and
  the crystalline indium oxide semiconductor film cannot be etched by a PAN acid mixture comprising phosphoric acid, acetic acid and nitric acid.
2. The thin film transistor according to 1, wherein the positive trivalent metal oxide is at least one selected from the group consisting of boron oxide, aluminum oxide, gallium oxide, scandium oxide, yttrium oxide, lanthanum oxide, praseodymium oxide, neodymium oxide, samarium oxide, europium oxide, gadolinium oxide, terbium oxide, dysprosium oxide, holmium oxide, erbium oxide, thulium oxide, ytterbium oxide and lutetium oxide.

3. A method for producing the thin film transistor according to claim 1 comprising:
forming a semiconductor film containing indium oxide and a positive trivalent metal oxide; and
oxidizing the semiconductor film and/or crystallizing the semiconductor film.

4. The method according to claim 3, wherein the semiconductor film is subjected to a heat treatment at 150° C. to 450° C. for 0.5 to 1200 minutes in the presence of oxygen.

5. The method according to claim 3, wherein the obtained thin film transistor is a channel-etch type thin film transistor.

6. The method according to claim 3, wherein the obtained thin film transistor is an etch stopper-type thin film transistor.

7. The thin film transistor according to claim 1, wherein the semiconductor film is an epitaxial or polycrystalline film.

8. The thin film transistor according to claim 1, wherein the semiconductor film is a polycrystalline film.

9. The thin film transistor according to claim 8, wherein the film comprises nanocrystals.

10. The thin film transistor according to claim 1, wherein the positive trivalent metal oxide is at least one selected from the group consisting of aluminum oxide, gallium oxide, yttrium oxide, samarium oxide, dysprosium oxide, holmium oxide, erbium oxide, and ytterbium oxide.

11. The thin film transistor according to claim 1, wherein the positive trivalent metal oxide is at least one selected from the group consisting of gallium oxide, yttrium oxide, and ytterbium oxide.

12. The method according to claim 4, wherein the obtained thin film transistor is a channel-etch type thin film transistor.

13. The method according to claim 4, wherein the obtained thin film transistor is an etch stopper-type thin film transistor.

14. The thin film transistor according to claim 1, wherein the M/(M+In) is from 0.0005 to 0.05.

15. The thin film transistor according to claim 1, wherein the M/(M+In) is from 0.001 to 0.05.

* * * * *